(12) United States Patent
Heuer et al.

(10) Patent No.: US 6,376,107 B1
(45) Date of Patent: Apr. 23, 2002

(54) ELECTROLUMINESCENT ARRANGEMENT USING DOPED BLEND SYSTEMS

(75) Inventors: Helmut-Werner Heuer; Rolf Wehrmann, both of Krefeld; Martin Deussen, Marburg; Andreas Elschner, Mülheim; Martin Hüppauff, Stuttgart, all of (DE)

(73) Assignee: Bayer Aktiengesellschaft (DE)

( * ) Notice: Subject to any disclaimer, the term of this patent is extended or adjusted under 35 U.S.C. 154(b) by 0 days.

(21) Appl. No.: 09/236,937

(22) Filed: Jan. 25, 1999

(30) Foreign Application Priority Data

Jan. 31, 1998 (DE) .......................................... 198 03 889

(51) Int. Cl.⁷ .............................................. H05B 33/14
(52) U.S. Cl. ....................... 428/690; 428/917; 313/504; 313/506; 427/66
(58) Field of Search ................................ 428/690, 704, 428/917; 313/504, 506; 427/66

(56) References Cited

U.S. PATENT DOCUMENTS

| | | | |
|---|---|---|---|
| 4,769,292 A | 9/1988 | Tang et al. ................. | 428/690 |
| 5,227,252 A | 7/1993 | Murayama et al. ......... | 428/690 |
| 5,276,381 A * | 1/1994 | Wakimoto et al. .......... | 313/504 |
| 5,281,489 A | 1/1994 | Mori et al. ................. | 428/690 |
| 5,554,450 A | 9/1996 | Shi et al. ................... | 428/690 |
| 5,593,788 A | 1/1997 | Shi et al. ................... | 428/690 |
| 5,616,427 A | 4/1997 | Tada .......................... | 428/690 |

FOREIGN PATENT DOCUMENTS

| | | |
|---|---|---|
| DE | 196 27 070 A1 | 1/1998 |
| EP | 532 798 | 3/1993 |
| EP | 731 625 | 9/1996 |
| EP | 766 498 | 4/1997 |

OTHER PUBLICATIONS

Kitahara K. et al: "Synthesis of Soluble Quinacridones" Journal of Heterocyclic Chemistry, 29, pp. 167–169, Jan.-–Feb. 1992.

Keller, U et al: "Hydrogen–Bonding and Phase–Forming Behavior of a Soluble Quinacridone" Advanced Materials, 8, No. 6, (1996), pp. 490–493. (no month).

* cited by examiner

Primary Examiner—Marie Yamnitzky
(74) Attorney, Agent, or Firm—Connolly Bove Lodge & Hutz LLP

(57) ABSTRACT

Electroluminescent arrangements, composed of a substrate, an anode, an electroluminescent element and a cathode, at least one of the two electrodes being transparent in the spectral range and it being possible for the electroluminescent element to contain the following zones: (1) a hole-injecting zone, (2) hole-transporting zone, (3) electroluminescent zone, (4) electron-transporting zone and/or (5) an electron-injecting zone, and at least one quinacridone which has sufficient solubility for a casting process is present in at least one of said zone and with the proviso that if more than one zone is present then the zones would be in the following order of (1) to (5) providing the zone is present.

17 Claims, No Drawings

ELECTROLUMINESCENT ARRANGEMENT USING DOPED BLEND SYSTEMS

This application claims priority to German Patent Application 198 03 889.5 filed Jan. 31, 1998 which is incorporated by reference in its entirety for all purposes.

An electroluminescent (EL) arrangement is characterized in that, with application of an electric voltage, it emits light with a flow of current. Such arrangement has long been known in industry by the name "light emitting diodes" (LEDs). The emission of light occurs as result of positive charges (holes) and negative charges (electrons) recombining with emission of light.

In the development of light-emitting components for electronics or photonics, mainly inorganic semiconductors, such as gallium arsenide, are used today. Point-like display elements can be produced on the basis of such substances. Extensive arrangements are not possible.

In addition to the semiconductor light emitting diodes, electroluminescent arrangements based on low molecular weight organic compounds applied by vapour deposition are known (U.S. Pat. No. 4,539,507, U.S. Pat. No. 4,769,262, U.S. Pat. No. 5,077,142, EP-A 406,762, EP-A 278,758, EP-A 278,757).

Furthermore, polymers such as poly-(p-phenylene) and poly-(p-phenylenevinylene) (PPV) are described as electroluminescent polymers: G. Leising et al., Adv. Mater. 4 (1992) No. 1; Friend et al., J. Chem. Soc., Chem. Commun. 32 (1992); Saito et al., Polymer, 1990, Vol. 31, 1137; Friend et al., Physical Review B, Vol. 42, No. 18, 11670 or WO 90/13148. Further examples of PPV in electroluminescent displays are described in EP-A 443 861, WO-A-9203490 and 92003491.

EP-A 0 294 061 presents an optical modulator based on polyacetylene.

For the production of flexible polymer LEDs, Heeger et al., have proposed soluble conjugated PPV derivatives (WO 92/16023).

Polymer blends of different compositions are likewise known: M. Stolka et al., Pure and Appl. Chem., Vol. 67, No. 1, pp 175–182, 1995; H. Bässler et al., Adv. Mater. 1995, 7, No. 6, 551; K. Nagai et al., Appl. Phys. Lett. 67 (16), 1995, 2281; EP-A 532 798.

The organic EL arrangements contain, as a rule, one or more layers of organic charge-transporting compounds. The basic structure in the sequence of the layers is as follows:
1 Carrier, substrate
2 Base electrode
3 Hole-injecting layer
4 Hole-transporting layer
5 Light-emitting layer
6 Electron-transporting layer
7 Electron-injecting layer
8 Top electrode
9 Contacts
10 Envelope, encapsulation.

The layers 3 to 7 constitute the electroluminescent element.

This structure represents the most general case and can be simplified by omitting individual layers so that one layer performs several functions. In the simplest case, an EL arrangement consists of two electrodes between which is located an organic layer which performs all functions —including the function of light emission. Such systems are described, for example, in the application WO 90/13148, on the basis of poly-(p-phenylenevinylene).

Tang et al. state that the efficiency of electroluminescent arrangements can be improved by using an emitter layer which consists of organic matrix material with which a small amount of a dopant has been mixed (U.S. Pat. No. 4,769,292). Preferred material is aluminium 8-hydroxyquinoline ($Alq_3$). The dopants can be chosen from a number of different classes of intensely fluorescent substances. Preferred examples of these are coumarins and rhodamines.

Murayama et al. describe insoluble quinacridone pigments as dopants (U.S. Pat. No. 5,227,252) which is incorporated by reference in its entirety for all purposes. Further, substituted but insoluble quinacridone pigments are described, all of which are applied by vapour deposition methods, together with the electroluminescent component (generally $Alq_3$) (covaporization) (EP 0 766 498 A2 and Tang, Information Display 10/96, C. W. Tang, Information Display 10/96, 16 (1996), T. Wakimoto, S. Kawami, K. Nagayania, Y. Yonemoto, R. Murayama, J. Funaki, H. Sato, H. Nakada, K. Imai, International Symposium of Inorganic and Organic Electroluminescence 1994, Hamamatsu, Japan 1994, Conference Volume S. 77, J/.Shi, C. W. Tang, Appl. Phys. Lett. 70 (13), 1665 (1997), U.S. Pat. No. 005,616,427 A). It was found that EL arrangements having a dopant in the organic emitter layer also had improved long-term behaviour during operation in addition to an increased efficiency.

Multilayer systems can be built up by vapour deposition methods, in which the layers are applied successively from the gas phase, or by casting methods. Owing to the higher process speeds, casting methods are preferred. However, the surface dissolution process of an already applied layer during overcoating with the next layer may present a difficulty in certain cases.

The object of the present invention is the provision of electroluminescent arrangements having high luminous density and improved stability, it being possible to use a casting method to apply the doped mixture to be applied.

For this purpose, it was necessary to synthesize specially substituted quinacridone derivatives which have sufficient solubility for the casting process in the solvents used. Cast, doped systems are said to have improved long-term behaviour compared with undoped systems.

It was found that electroluminescent arrangements which contain the blend system stated below meet these requirements. Below, the term zone is also equivalent to layer.

The present invention therefore relates to electroluminescent arrangements containing a substrate, an anode, an electroluminescent element and a cathode, at least one of the two electrodes being transparent in the visible spectral range and it being possible for the electroluminescent element to contain in sequence:

A hole-injecting zone, hole-transporting zone, electroluminescent zone, electron-transporting zone and/or an electron-injecting zone, characterized in that the hole-injecting and/or hole-transporting zone is an optionally substituted tris-1,3,5-(aminophenyl)benzene compound A or a mixture thereof and the electroluminescent element optionally contains a further functionalized compound from the group consisting of the hole-transporting materials, a luminescent material B and optionally electron-transporting materials, it being possible for the hole-injecting and hole-transporting zone to contain one or more further hole-transporting compounds in addition to the component A, at least one zone being present, it being possible to omit individual zones and it being possible for the zone(s) present to perform several functions, the electroluminescent element containing a substituted quinacridone compound C as a dopant in at least one zone.

A zone may perform several functions, that is to say that a zone may contain, for example, hole-injecting, hole-transporting, electroluminescent, electron-injecting and/or electron-transporting substances and dopant.

The electroluminescent element may furthermore contain one or more transparent polymeric binders D.

The optionally substituted tris-1,3,5-(aminophenyl) benzene compound A represents an aromatic tertiary amino compound of the general formula (I)

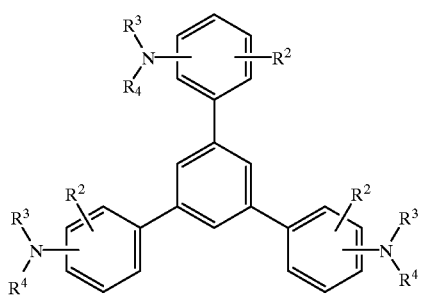

(I)

in which
R² represents hydrogen, optionally substituted alkyl or halogen, wherein the substituent is alkoxy, aryl, OH or halogen,
R³ and R⁴, independently of one another, represent hydrogen, optionally substituted $C_1$–$C_{10}$-alkyl, alkoxycarbonyl-substituted $C_1$–$C_{10}$-alkyl, or aryl, aralkyl or cycloalkyl, each of which is optionally substituted with a hydrocarbon, halogen heteroatom, hydroxy or alkoxy.
R³ and R⁴, independently of one another, preferably represent $C_1$–$C_6$-alkyl, in particular methyl, ethyl, n- or iso-propyl, n-, iso-, sec- or tert-butyl, $C_1$–$C_4$-alkoxycarbonyl-$C_1$–$C_6$-alkyl, such as, for example, methoxy-, ethoxy-, propoxy- or butoxycarbonyl-$C_1$–$C_4$-alkyl, or phenyl-$C_1$–$C_4$-alkyl, naphthyl-$C_1$-$C_4$-alkyl, cyclopentyl, cyclohexyl, phenyl or naphthyl, each of which is optionally substituted by $C_1$–$C_4$-alkyl and/or $C_1$–$C_4$-alkoxy.
R³ and R⁴, independently of one another, particularly preferably represent unsubstituted phenyl or naphthyl or phenyl or naphthyl, each of which is monosubstituted to trisubstituted by methyl, ethyl, n- or iso-propyl, methoxy, ethoxy, n- and/or iso-propoxy.
R² preferably represents hydrogen, $C_1$–$C_6$-alkyl, such as, for example, methyl, ethyl, n- or iso-propyl, n-, iso-, sec- or tert-butyl, or chlorine.

Such compounds and their preparation are described in U.S. Pat. No. 4,923,774 for use in electrophotography, which is hereby expressly incorporated by reference as part of the description. The tris-nitrophenyl compound can be converted into the tris-aminophenyl compound, for example by generally known catalytic hydrogenation, for example in the presence of Raney Nickel (Houben-Weyl 4/1C, 14–102, Ullmann (4), 13, 135–148). The amino compound is reacted in a generally known manner with substituted halogenobenzenes.

The following compounds may be mentioned by way of example, it being possible for the substitution on the phenyl ring to take place ortho, meta and/or para to the amine nitrogen:

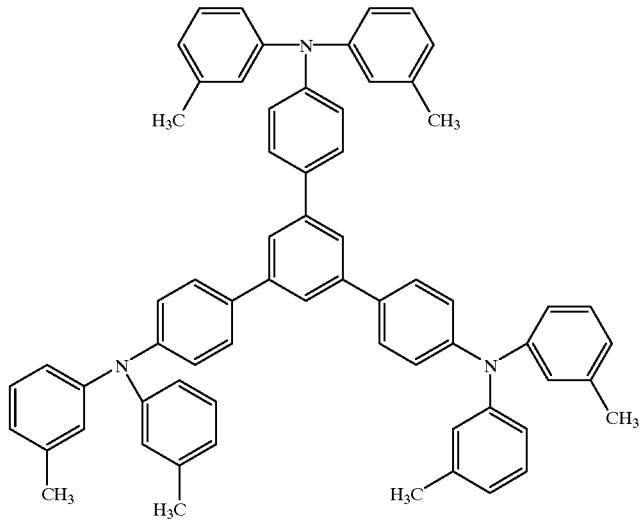

A₁

-continued
$A_2$
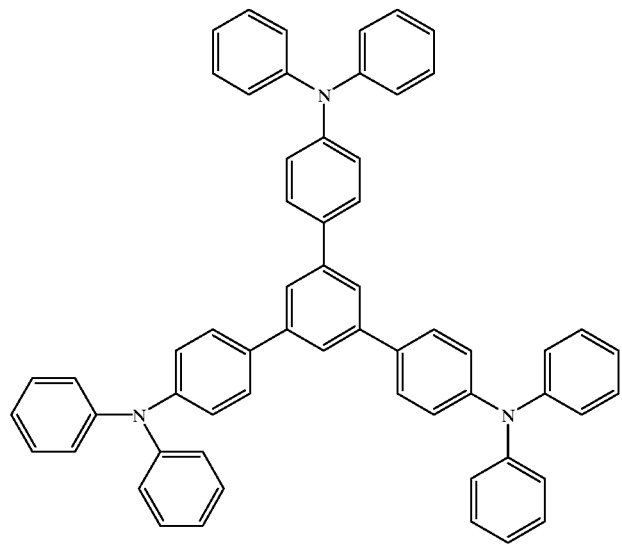
$A_3$
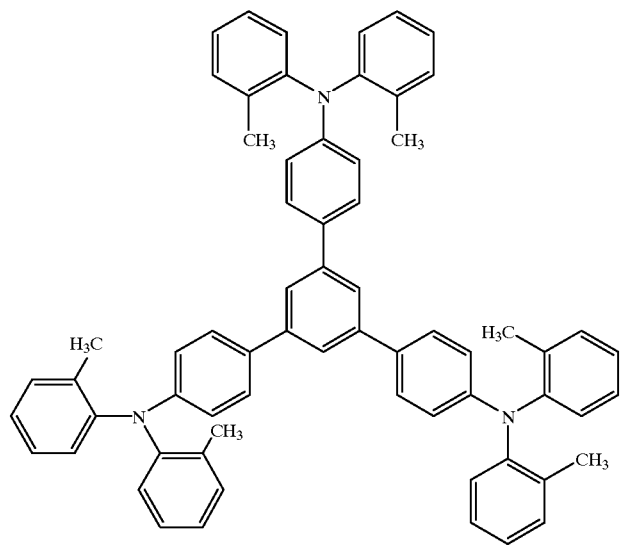
$A_4$
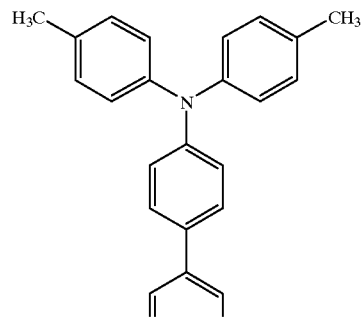

In addition to the component A, further hole conductors, for example in the form of a mixture with the component A, may optionally be used for producing the electroluminescent elements. These may be, on the one hand, one or more compounds of the formula (I), mixtures of isomers also being included, and, on the other hand, also mixtures of hole-transporting compounds with compounds of A—of the general formula (I)—having different structures.

A list of possible hole-injecting and hole-conducting materials is given in EP-A 532 798 which corresponds to U.S. Pat. No. 5,281,489 which is incorporated by reference in its entirety for all purposes.

In the case of mixtures of the component A), the compound can be used in any desired ratio between 0 and 100% by weight (based on the mixture A)). In a preferred embodiment, 1 to 99% by weight and 99 to 1% by weight, particularly preferably about 5 to about 95% by weight and about 95 to about 5% by weight, are used. In a further preferred embodiment, about 30 to about 70% by weight and about 70 to about 30% by weight are used.

The following may be mentioned by way of example:

Anthracene compounds, e.g. 2,6,9,10-tetraisopropoxyanthracene; oxadiazole compounds, e.g. 2,5-bis(4-diethylaminophenyl)-1,3,4-oxadiazole, triphenylamine compounds, e.g. N,N'-diphenyl-N,N'-di(3-methylphenyl)-1,1'-biphenyl-4,4'-diamine; aromatic tertiary amines, e.g. N-phenylcarbazole, N-isopropyl-carbazole and compounds which can be used in hole-transporting layers, as described in Japanese Patent Application Publication No. 62-264 692; furthermore pyrazoline compounds, e.g. 1-phenyl-3-(p-diethylaminostyryl)-5-(p-diethylaminophenyl)-2-pyrazoline; styryl compounds, e.g. 9-(p-diethylaminostyryl)-anthracene; hydrazone compounds, e.g. bis-(4-dimethylamino-2-methylphenyl)-phenyl-methane; stilbene compounds, e.g. -(4-methoxyphenyl)-4-N,N-diphenylamino-(4'-methoxy) stilbene, enamine compounds, e.g. 1,1-(4,4'-diethoxyphenyl)-N,N-(4,4'-dimethoxyphenyl)enamine; metal- or nonmetal-phthalocyanines and porphyrin compounds.

Triphenylamine compounds and/or aromatic tertiary amines are preferred, the compounds mentioned by way of example being particularly preferred.

Materials which have hole-conducting properties and can be used for mixing with component A are, for example

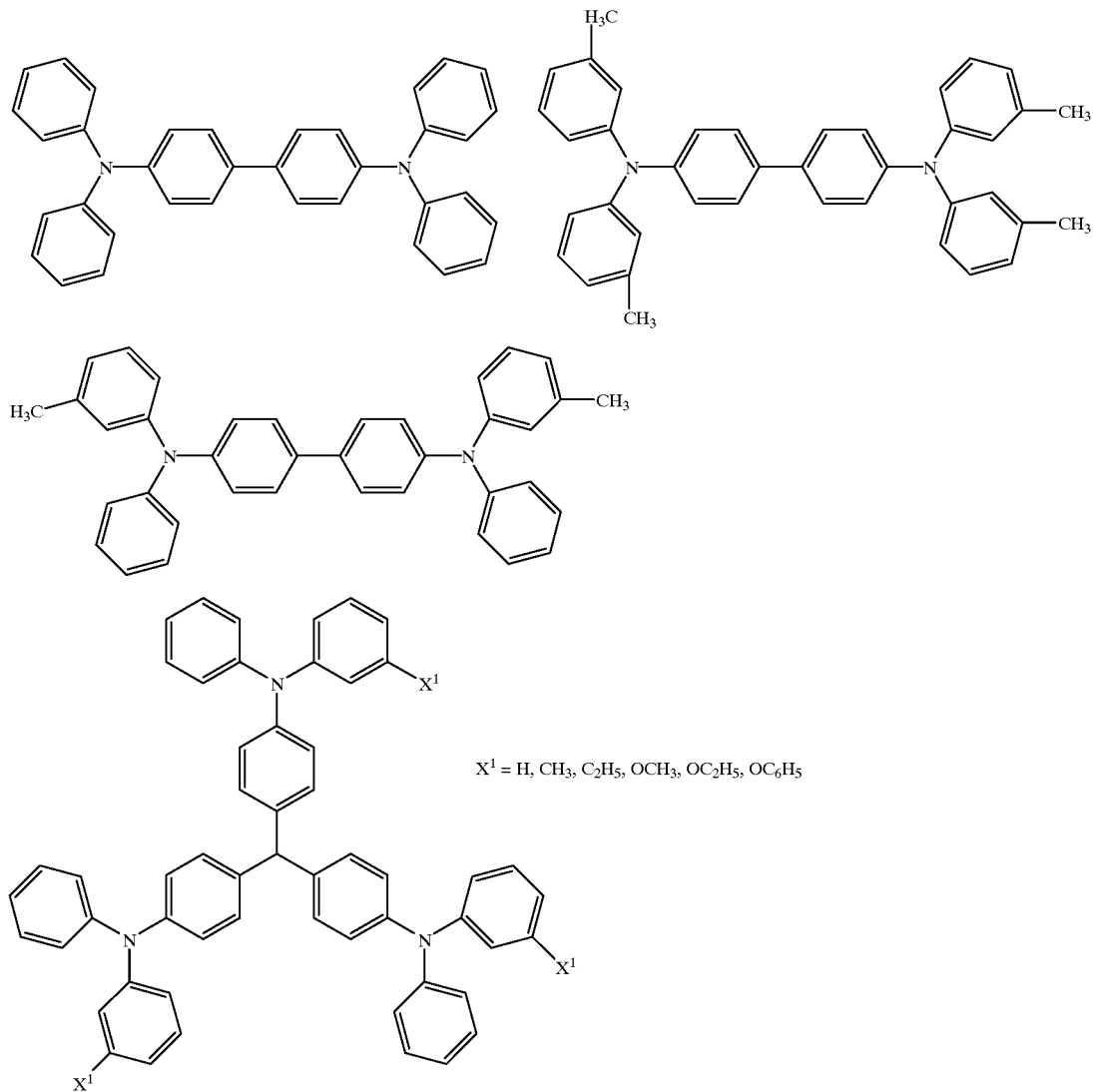

$X^1$ = H, $CH_3$, $C_2H_5$, $OCH_3$, $OC_2H_5$, $OC_6H_5$

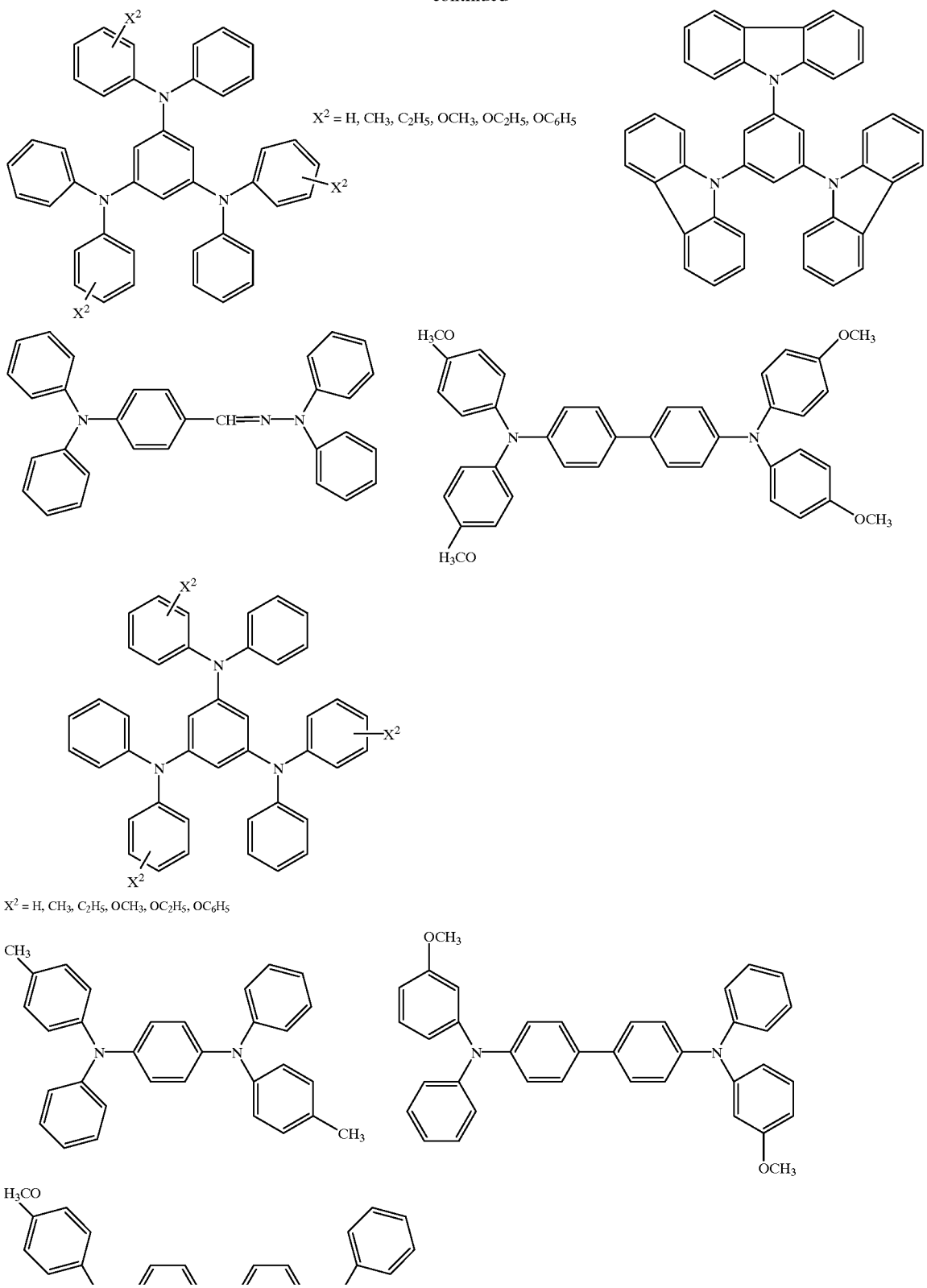

These and further examples are described in J. Phys. Chem. 1993, 97, 6240–6248 and Appl. Phys. Lett., Vol. 66, No. 20, 2679–2681.

The component B) represents a compound of the general formula (II)

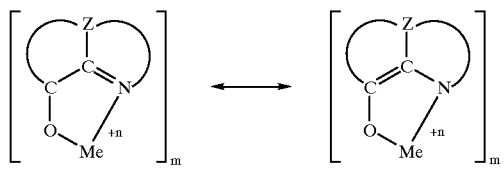

in which

Me represents a metal, m is a number from 1 to 3 and

Z independently in the two forms, represents atoms which complete a nucleus which consists at least of 2 fused rings.

In general, monovalent, divalent or trivalent metals which are known to form chelates may be used.

The metal may be a monovalent, divalent or trivalent metal, preferably of the 1st, 2nd and 3rd main group and 2nd subgroup of the Periodic Table, for example lithium, sodium, potassium, magnesium, calcium, boron, aluminium, indium, gallium, zinc and beryllium.

Z completes the heterocyclic molecular moiety which consists at least of two fused rings, one of which is an azole or azine ring, it being possible for further additional aliphatic or aromatic ring to be bonded to the two fused rings.

Suitable examples for the component B) are the oxine complexes (8-hydroxyquinoline complexes) of $Al^{3+}$, $Mg^{2+}$, $In^{3+}$, $Ga^{3+}$, $Zn^{2+}$, $Be^{2+}$, $Li^+$, $Ca^{2+}$, $Na^+$ or aluminiumtris(5-methyloxine) and galliumtris(5-chloro-quinoline). Complexes with rare earth metals may also be used.

Examples of component B are

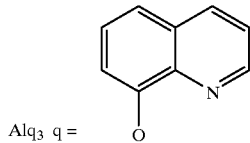

$Alq_3$ q =

$Inq_3$, $Gaq_3$, $Znq_2$, $Beq2$, $Mgq_2$, or $Al(qa)_3$, $Ga(qa)_3$, $In(qa)_3$, $Zn(qa)_2$, $Be(qa)_2$, $Mg(qa)_2$ in which (qa) represents

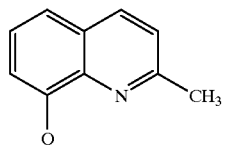

One or more compounds of the component B) may be used.

The compounds or oxine complexes according to B) are generally known or can be prepared by known processes (cf. for example U.S. Pat. No. 4,769,292) which is incorporated by references in its entirety for all purposes.

The substituted quinacridone compounds C) have the following general formulae (IIIa) and (IIIb)

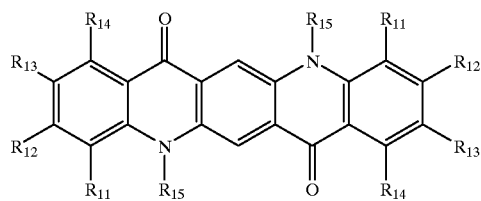

in which $R_{11}$, $R_{12}$, $R_{13}$ and $R_{14}$, independently of one another, represent hydrogen, halogen and optionally halogen-substituted $C_1$–$C_{15}$-alkyl, $C_1$–$C_{16}$-alkoxy, $C_1$–$C_{20}$-alkylthio, cycloalkyl, optionally substituted aryl or arylalkyl, at least 2 radicals per outer phenyl ring not simultaneously representing hydrogen and it being possible additionally for alkylation to be present at both nitrogen atoms, wherein the substituents are alkoxy, halogen or alkyl, $R_{15}$ represents hydrogen or optionally substituted $C_1$–$C_{18}$-alkyl or optionally substituted cycloalkyl, $R_{11}$, $R_{12}$, $R_{13}$ and $R_{14}$, independently of one another, preferably represent $C_1$–$C_6$-alkyl, in particular methyl, tert-butyl, $C_1$–$C_{12}$-alkoxy, in particular methoxy, dodecyloxy, and $C_4$–$C_{10}$-alkylthio, in particular octylthio, halogeno-$C_1$–$C_4$-alkyl, in particular trifluoromethyl, $R_{15}$ preferably represents hydrogen, $C_1$–$C_8$-alkyl, in particular methyl, octyl, tert-butyl or cyclohexyl.

Halogen preferably represents fluorine, chlorine, bromine.

The following may be mentioned as examples of such compounds:

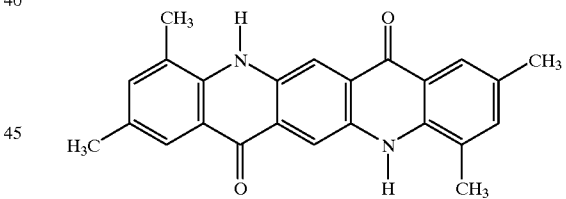

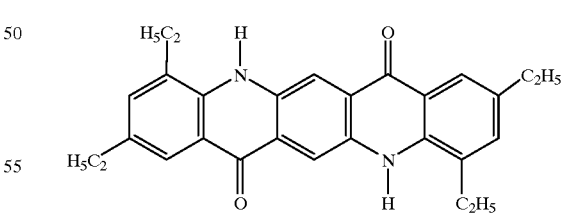

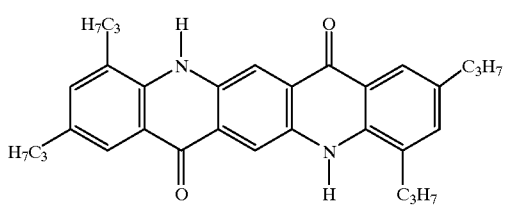

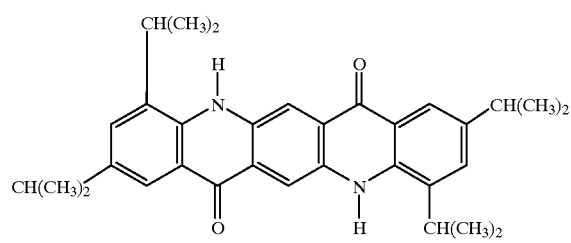
C4
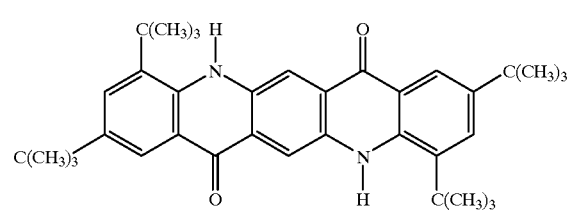
C5
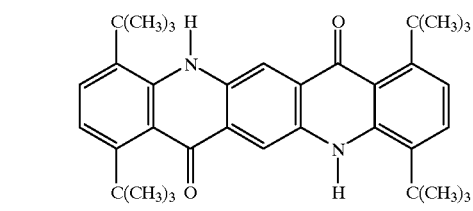
C6
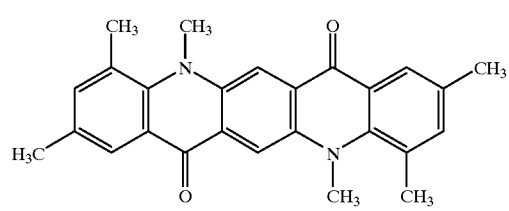
C7
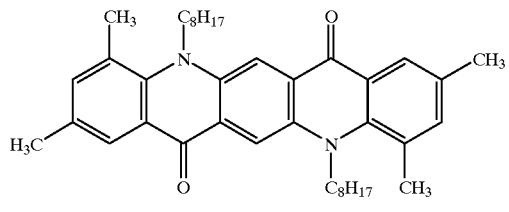
C8
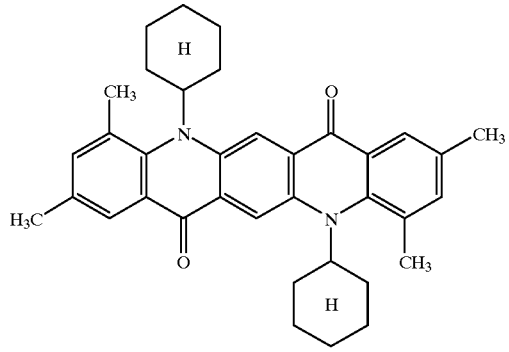
C9
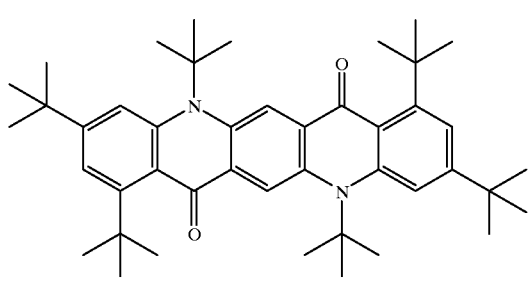
C10
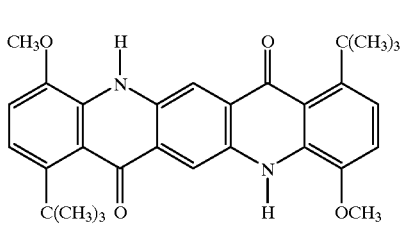
C11
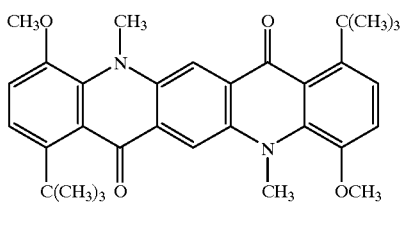
C12
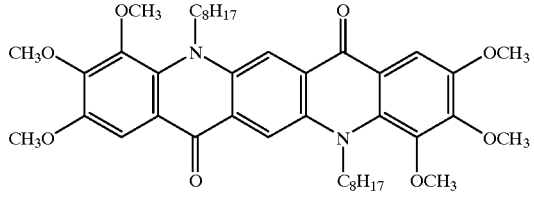
C13
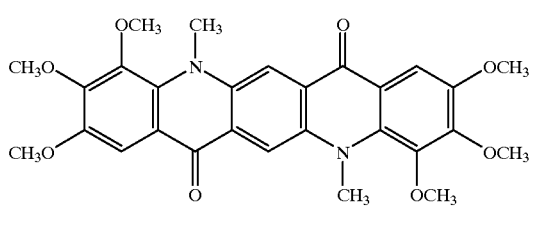
C14
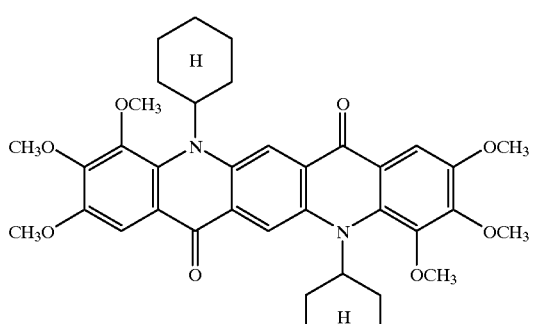
C15

C16

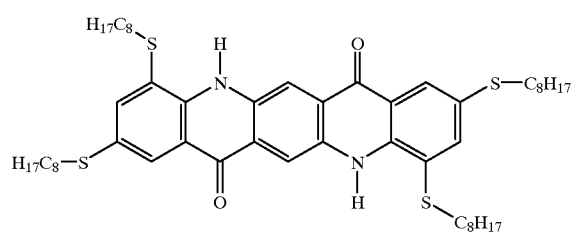

C17

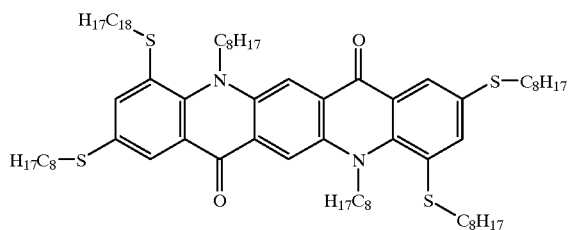

C18

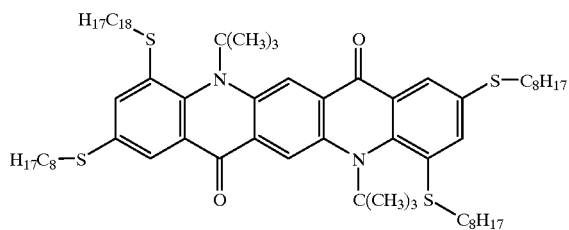

C19

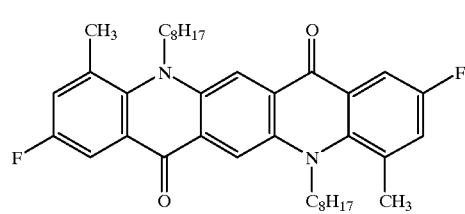

C20

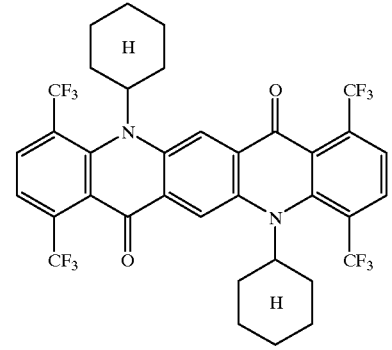

C21

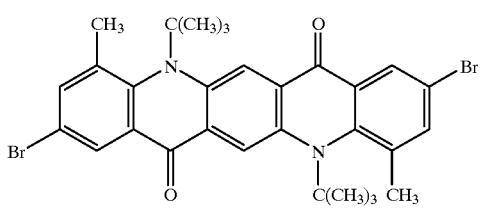

C28

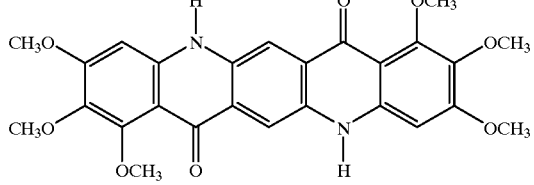

The substituted quinacridone compound C) may also have the following general formulae (IIIb) (stereoisomers):

(IIIb1)

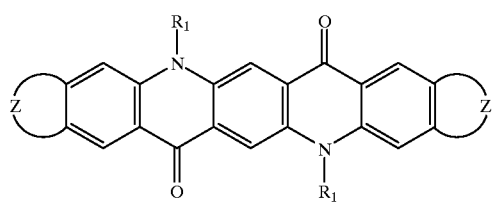

(IIIb2)

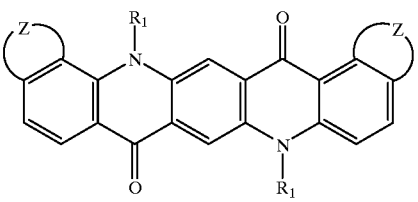

(IIIb3)

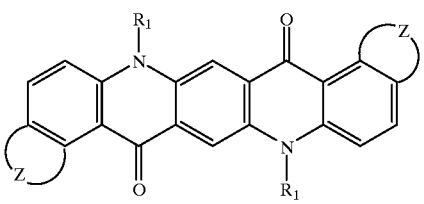

(IIIb4)

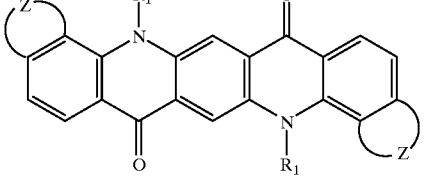

(IIIb5)

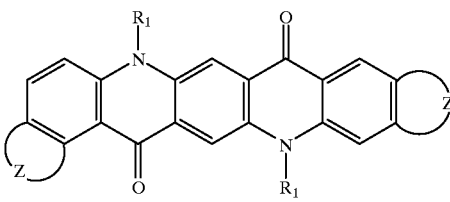

in which

Z, independently in the two rings, represents atoms which complete a ring, preferably an aliphatic ring having 3 to 12 carbon atoms which may be interrupted by one or more, hetero atoms, such as but not limited to, O, S, P or N in particular 2 to 5, oxygen atoms, $R_1$ represents hydrogen, $C_1$–$C_{16}$-alkyl, preferably $C_1$–$C_{10}$-alkyl, in particular methyl, octyl, tert-butyl, or cyclohexyl.

The following may be mentioned as examples of such compounds:

C22
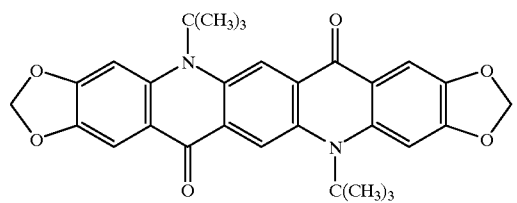

C23
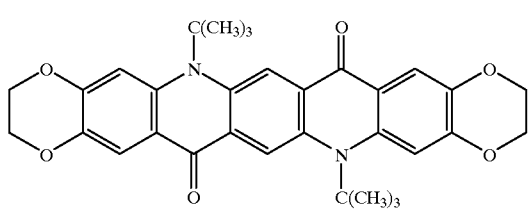

C24
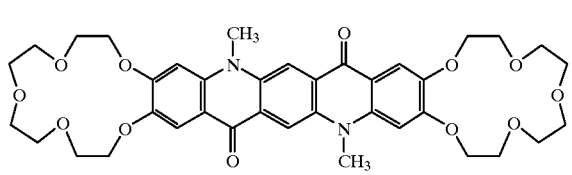

C25
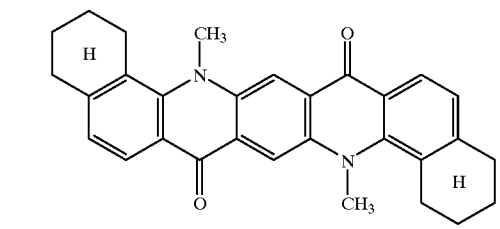

C26
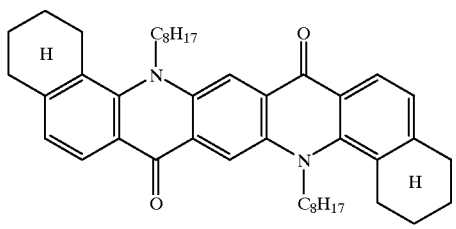

C27
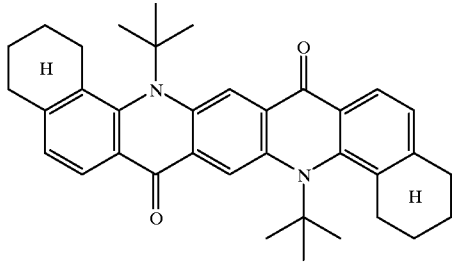

Component C may also be mixtures of possible stereoisomers of the general forms (IIIa) and (IIIb).

The quinacridone derivatives of the formula (III) are known or can be prepared by known methods, cf., for example, the following reaction scheme:

A)

1.
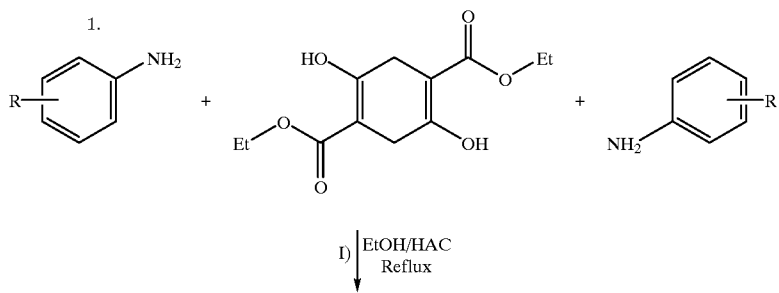

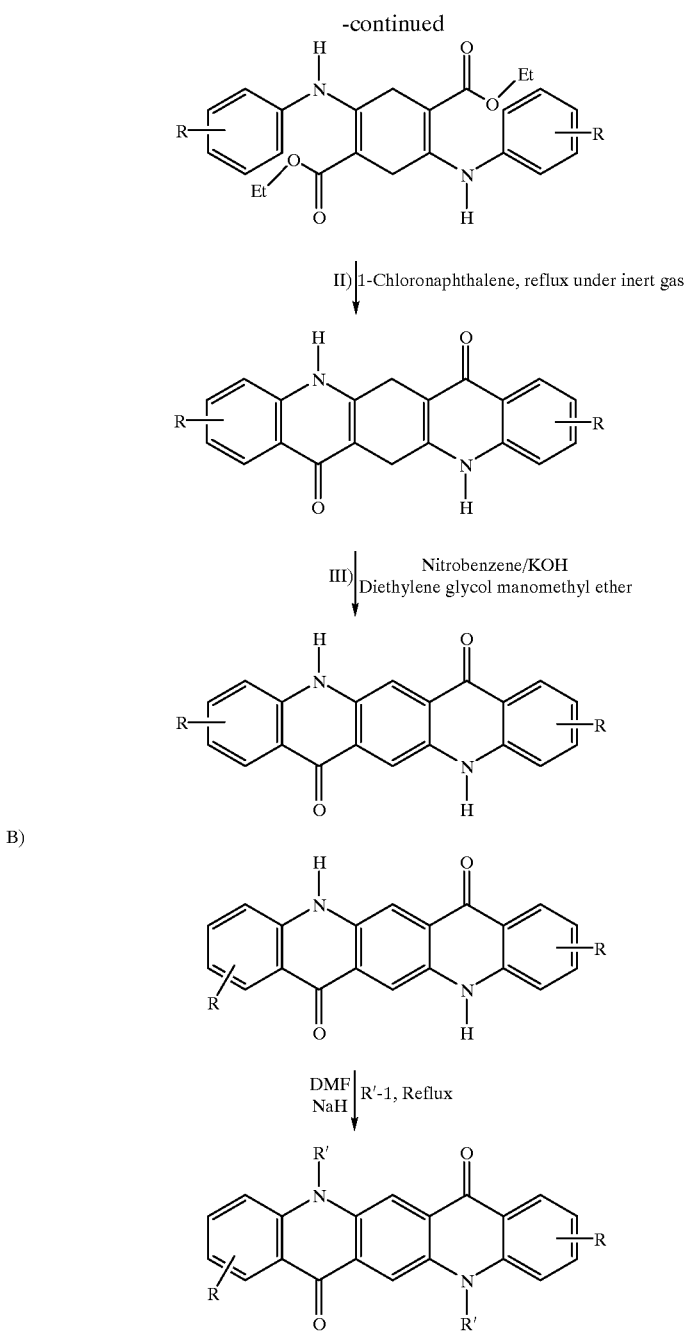

R and R' represent one or more radicals $R_{11}$, $R_{12}$, $R_{13}$, $R_{14}$ and have the abovementioned meaning.

The starting materials are known or commercially available or can be prepared by generally known methods of organic chemistry.

The binder D) represents polymers and/or copolymers, such as, for example, poly-carbonates, polyester carbonates, copolymers of styrene, such as styrene-acrylonitrile ("SAN") or styrene acrylates, polysulphones, polymers based on monomers containing vinyl groups, such as, for example, poly(meth)acrylates, polyvinylpyrrolidone, polyvinylcarbazole, vinyl acetate and vinyl alcohol polymers and copolymers, polyolefins, cyclic olefin copolymers, phenoxy resins, etc. Mixtures of different polymers may also be used. The polymeric binders C) have molecular weights of 10,000 to 200,000 g/mol, are soluble and film-forming and are transparent in the visible spectral range. They are described, for example, in Encyclopedia of Polymer Science and Engineering, 2nd Ed., A. Wiley Interscience publication. They are usually used in an amount up to about 95, preferably up to about 80, % by weight, based on the total weight of A) and B).

The electroluminescent arrangements according to the invention are characterized in that they have a light-emitting layer which contains a mixture of the components A), B) and C) in, optionally, a transparent binder D). The weight ratio of A), B) and C) to one another can be varied.

The sum of the amounts by weight of A) and B) in polymeric binder is in the range from about 0.2 to about 98% by weight, preferably from about 2 to about 95% by weight, particularly preferably from about 10 to about 90% by weight, very particularly preferably from about 10 to about 85% by weight.

The weight ratio A:B of the components A and B is between about 0.05 and about 20, preferably about 0.2 and about 10 and particularly preferably between about 0.3 and about 8, in particular about 0.3 to about 7. The components A) and B) may consist of either one component or a mixture of components having any desired composition.

The quinacridone compound C) is present in the electroluminescent element, it being possible for it to be contained as a dopant in low concentration in any desired layer. It is also possible that it is contained simultaneously in several layers of the EL element, in each case in a different concentration.

Preferably, the dopant is added to the hole-transporting layer and/or light-emitting layer and/or electron-transporting layer, very particularly preferably to the light-emitting or light-transporting layer.

The concentration of C) in the respective guest matrix is, independently of one another, between about 0.01 and about 40% by weight, preferably between about 0.4 and about 10% by weight (based on 100% by weight of components A) and B)).

For the production of the layer, the components A), B), C) and optionally D) are dissolved in a suitable solvent and are applied to a suitable substrate by casting, knife-coating or spin-coating. Said substrate may be, for example, glass or a plastics material which is provided with a transparent electrode. For example, a film of polycarbonate, polyester, such as polyethylene terephthalate, polybutyl terphthalate, or polyethylene naphthalate, polysulphone or polyimide may be used as plastics material.

Suitable as transparent electrodes are
a) metal oxides, e.g. indium tin oxide (ITO), tin oxide (NESA), zinc oxide, doped tin oxide, doped zinc oxide, etc.,
b) semi-transparent metal films, e.g. Au, Pt, Ag, Cu, etc.,
c) conductive polymer films, such as polyanilines, polythiophenes, etc.

The metal oxide electrodes and the semitransparent metal film electrodes are applied in a thin layer by techniques such as vapour deposition, sputtering, platinization, etc. The conductive polymers films are applied from the solution by techniques such as spin coating, casting, knife coating, etc.

The thickness of the transparent electrode is 3 nm to about several $\mu$m or preferably about 10 nm to about 500 nm.

The electroluminescent layer is applied as a thin film, directly to the transparent electrode or to an optionally present charge-transporting layer. The thickness of the film is about 10 to about 500 nm, preferably about 20 to about 400 nm, particularly preferably about 50 to about 250 nm.

A further charge-transporting layer may be added to the electroluminescent layer before a counter-electrode is applied.

A list of suitable charge-transporting intermediate layers which may comprise hole- and/or electron-conducting materials, which may be present in polymeric or low molecular weight form, optionally as a blend, is given in EP-A 532 798 which corresponds to U.S. Pat. No. 5,281,489 which is incorporated by reference in its entirety. Particularly suitable are specially substituted polythiophenes which have hole-transporting properties. They are described, for example, in EP-A 686 662 which corresponds to U.S. Pat. No. 5,766,515 which is incorporated by reference in its entirety for all useful purposes. The stated references are expressly incorporated by reference in the description.

The content of low molecular weight hole-conductor in a polymeric binder can be varied in the range from about 2 to about 97% by weight; the content is preferably about 5 to about 95% by weight, particularly preferably about 10 to about 90% by weight. The hole-injecting or hole-conducting zones can be deposited by various methods.

Film-forming hole conductors may also be used in pure form (100% strength). Optionally, the hole-injecting or hole-conducting zone may also contain proportions of an electroluminescent material.

Blends which consist exclusively of low molecular weight compounds can be applied by vapour deposition; soluble and film-forming blends which may (not necessarily) also contain a binder D) in addition to low molecular weight compounds and dopant can be deposited from a solution, for example by means of spin coating, casting or knife coating.

It is also possible to apply emitting and/or electron-conducting substances in a separate layer onto the hole-conducting layer with the component A. An emitting substance according to component C) can also be added as the dopant to the layer containing the compound A, and in addition an electron-conducting substance can be applied. The electroluminescent substance may also be added to the electron-injecting or electron-conducting layer.

The content of low molecular weight electron conductors in the polymeric binder can be varied in the range from about 2 to about 95% by weight; the content is preferably about 5 to about 90% by weight, particularly preferably about 10 to about 85% by weight. Film-forming electron conductors can also be used in pure form (100% strength).

The counter-electrode consists of a conductive substance which may be transparent. Suitable metals are preferably, for example, Al, Au, Ag, Mg, In, etc. or alloys and oxides thereof, which can be applied by techniques such as vapour deposition, sputtering or platinization.

The arrangement according to the invention is brought into contact with the two electrodes by two electric leads (e.g. metal wires).

On application of a DC voltage in the range from about 0.1 to about 100 volt, the arrangements emit light of a wavelength from about 200 to about 2000 nm. They exhibit photoluminescence in the range from about 200 to about 2000 nm.

The arrangements according to the invention are suitable for the production of units for illumination and for information display.

EXAMPLES

A) Synthesis I

The synthesis of substituted quinacridones is carried out in a 3-stage synthesis from diethyl 2,5-dihydroxy-1,4-cyclohexadiene-1,4-dicarboxylate (diester of succinylosuccinic acid) and the corresponding aniline compound according to the following reaction scheme

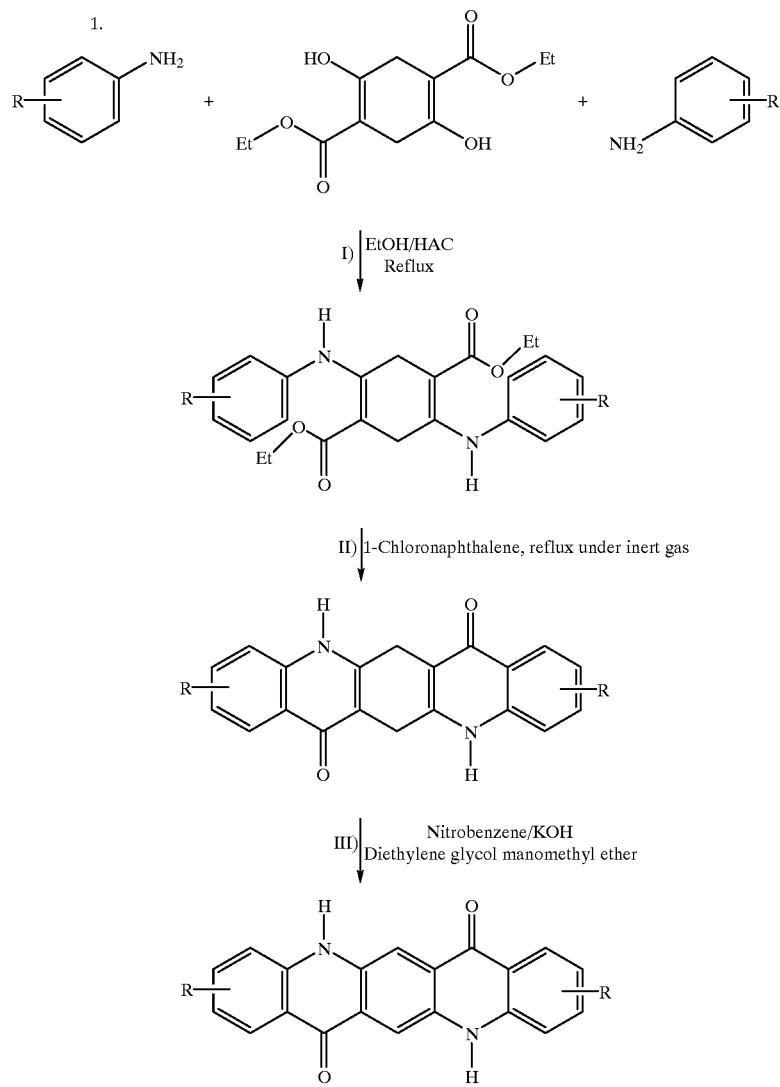

The individual synthesis steps are described in more detail, for example, in:

R. H. Altiparmakian, H. Bohler, B. L. Kaul, F. Kehrer, Helvetica Chimica Acta Vol. 55, 85–100 (1972)

K. Kitahara, H. Yanagimoto, N. Nakajima, H. Nishi, J. Heterocyclic Chem. 29, 167–169(1992)

V. Keller, K. Müller, S. De Feyter, F. C. De Schryver, Adv. Mater. 8, No. 6, 490–493 (1996).

Example 1

Synthesis of Compound ($C_1$)

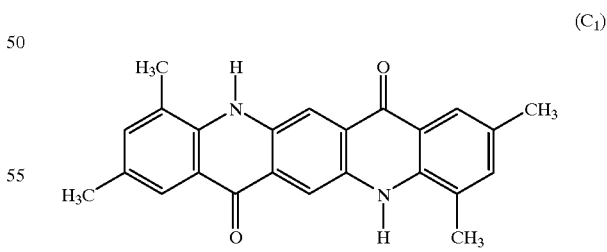

a) 1st stage 4.85 g (40 mmol) of 2,4-dimethylaniline and 5.13 g (20 mmol) of diethyl 2,5-di-hydroxy-1,4-cyclohexadiene-1,4-di-carboxylate are refluxed for 7 h in a mixture of 1000 ml of ethanol and 400 ml of acetic acid under argon. After cooling to room temperature, the pale red precipitate which has separated out is separated off and is washed with warm ethanol. After drying, 2.54 g (27.5% of theory) of a pink solid is obtained, which could be used without further purification for the 2nd reaction stage.

b) 2nd stage 70 ml of 1-chloronaphthalene are added to 2.5 g (5.5 mmol) of Example 1a) and thoroughly freed from oxygen in a vacuum from an oil pump, by repeated evacuation and flushing with argon. The mixture is refluxed on the metal bath at 260° C. for 1 h.

After cooling, the solvent is separated off under reduced pressure. The solid residue obtained is boiled several times in acetone and filtered hot in order to remove by-products. After drying, 1.57 g (78% of theory) of a pink solid are obtained.

c) 3rd stage 1.5 g (4.1 mmol) of Example 1b) and 1.25 g of KOH are dissolved in 75 ml of diethylene glycol monomethyl ether at about 80° C. 2.5 ml of nitrobenzene are added in one portion to the solution obtained and boiling is then carried out for 4.5 hours at 75° C. while stirring. Thereafter, 10 ml of acetic acid are added to the reaction batch and stirring is continued for 10 minutes at room temperature. After dilution with 60 ml of ethanol, the deep red solid obtained is separated off and is washed several times with warm ethanol and ethanol. Further purification is effected with hot tetrahydrofuran (THF). Final purification is effected by sublimation.

Example 2

Synthesis of Compound ($C_6$)

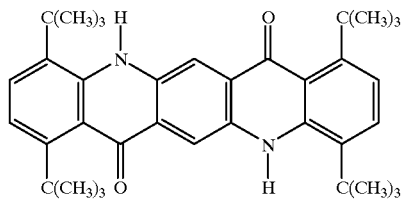

a) 1st stage 30 g (146.1 mmol) of 2,5-di-tert-butylaniline and 18.7 g (73.05 mmol) of diethyl 2,5-di-hydroxy-1,4-cyclohexadiene-1,4-di-carboxylate are refluxed for 26 h in a mixture of 1000 ml of ethanol and 400 ml of acetic acid under argon. After cooling to room temperature, the pale red precipitate which has separated out is separated off and is washed with warm ethanol. After drying, 33.2 g (72% of theory) of a pale red solid are obtained, which can be used without further purification for the 2nd reaction stage.

b) 2nd stage 280 ml of 1-chloronaphthaline are added to 15 g (23.8 mmol) of Example 2a) and thoroughly freed from oxygen in a vacuum from an oil pump, by repeated evacuation and flushing with argon. The mixture is refluxed on the metal bath at 260° C. for 3 h. After cooling, the solvent is separated off under reduced pressure. The solid residue obtained is boiled several times in acetone and filtered hot in order to remove by-products. After drying, 5 g (39% of theory) of a pink solid are obtained.

c) 3rd stage 5 g (9.3 mmol) of Example 2b) and 3.7 g of KOH are dissolved in 200 ml of diethylene glycol monomethyl ether at about 80° C. 7.5 ml of nitrobenzene are added in one portion to the solution obtained and boiling is then carried out for about 4 hours at 75° C. while stirring. Thereafter, 10 ml of acetic acid are added to the reaction batch and stirring is continued for 10 minutes at room temperature. After dilution with 100 ml of ethanol, the deep red solid obtained is separated off and is washed several times with warm ethanol and methanol. Further purification is effected in hot THF. After drying, 0.66 g (13.2% of theory) of a red solid is obtained. Final purification is effected by sublimation.

Example 3

Synthesis of Compound ($C_{28}$)

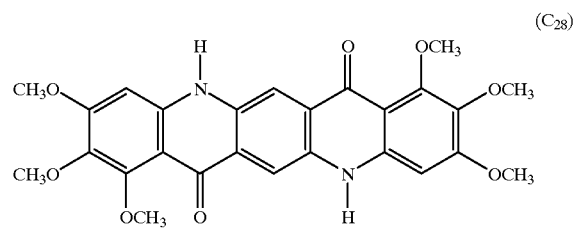

a) 1st stage 14.3 g (78.04 mmol) of 3,4,5-trimethoxyaniline and 10 g (39.02 mmol) of diethyl 2,5-di-hydroxy-1,4-cyclohexadiene-1,4-dicarboxylate are refluxed in a mixture of 500 ml of ethanol and 200 ml of acetic acid for 26 h under argon. After cooling to room temperature, the pale red precipitate which has separated out is separated off and is washed with warm ethanol. After drying, 18.25 g (79.7% of theory) of a pale red solid are obtained, which could be used without further purification for the 2nd reaction stage.

b) 2nd stage 85 ml of 1-chloronaphthaline are added to 5 g (8.52 mmol) of Example 3a) and thoroughly freed from oxygen in a vacuum from an oil pump, by repeated evacuation and flushing with argon. The mixture is refluxed on the metal bath at 260° C. for 3 h. After cooling, the solvent is separated off under reduced pressure. The solid residue obtained is boiled several times in acetone and filtered hot in order to remove by-products. After drying, 32.6 g (77.3% of theory) of a pink solid are obtained.

c) 3rd stage 3 g (6.06 mmol) of Example 2b) and 3.5 g of KOH are dissolved in 200 ml of diethylene glycol monomethyl ether at about 80° C. 7.0 ml of nitrobenzene are added in one portion to the solution obtained and boiling is then carried out for about 4 hours at 75° C. while stirring. Thereafter, 10 ml of acetic acid are added to the reaction batch and stirring is continued for 10 minutes at room temperature. After dilution with 100 ml of ethanol, the deep red solid obtained is separated off and is washed several times with warm ethanol and methanol. Further purification is effected with hot THF. After drying, 1.57 g (52.5% of theory) of a red solid are obtained. Final purification is effected by sublimation.

Depending on the parent aniline component, all parent quinacridone structures can be synthesized by processes analogous to Examples 1 to 3 and are further reacted in a subsequent N-alkylation step:

Synthesis II:

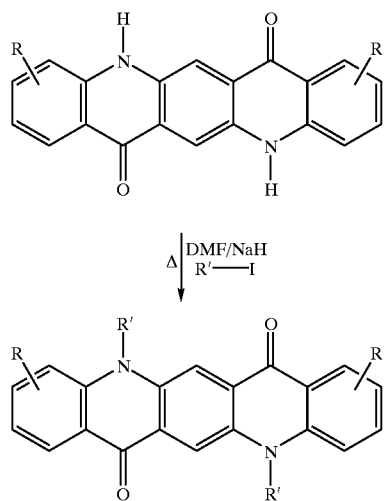

N,N-Dialkylquinacridone derivative

B) EL Arrangements

The following 2 examples illustrate EL arrangements.

Example 1

The substance $C_6$ was dissolved in methanol so that the extinction at 500 nm in a 10 nm quartz cell is E=0.04. A fluorescence spectrum and an excitation spectrum of this solution were recorded on a fluorescence spectrometer (Edinburgh, FS 900), FIG. 1. The maximum of the excitation spectrum is at 505 nm and the maximum of the emission at 540 nm. The quantum efficiency of the substance in methanol on excitation at $_{ex}$505 nm is 0=0.33.

Example 2

The substance $C_6$ according to the invention is used for producing an organic light-emitting diode (OLED). In the production of the OLED, the following procedure is adopted:
1. Cleaning of the ITO Substrate
   ITOa-coated glass (Merck Balzers AG, Germany, FL, Part No. 253 674 XO) is cut into 50 mm×50 mm pieces (substrates). The substrates are then cleaned in 3% strength aqueous Mukasol solutions in an Ultrasound bath for 15 min. Thereafter, the substrates are rinsed with distilled water and spun dry in a centrifuge. This washing and drying process is repeated 10 times.
2. Application of the Baytron P Layer to the ITO
   About 10 ml of the 1.3% strength polyethylenedioxythiophene/polysulphonic acid solution (Bayer AG, Leverkusen, Germany, Baytron P) are filtered (millipore HV, 0.45 µm). The substrate is then placed on a spin coater and the filtered solution is distributed over the ITO-coated side of the substrate. The supernatant solution is then spun off by rotating the table at 500 rpm over a period of 3 min. The substrate coated in this manner is then dried for 5 min at 100° C. on a hot plate. The layer thickness is 60 nm (Tencor, Alphastep 200).

3. Application of the Light-Emitting Layer 5 ml of 0.5% strength dichloroethane solution comprising 1 part by weight of polyvinylcarbazole (BASF AG, Ludwigshafen, Germany, Luvican), 1 part by weight of phenylamine and 0.2 part by weight of $C_6$ are filtered (Millipore HV, 0.45 µm) and distributed over the dried Baytron-P layer. The supernatant solution is then spun off by rotating the table at 100 rpm for 30 sec. The substrate coated in this manner is then dried for 5 min at 110° C. on a hot plate. The total layer thickness is 150 nm.

4. Application of the Metal Cathode by Vapour Deposition

A metal electrode is applied to the organic layer system by vapour deposition. For this purpose, the substrate is placed, with the organic layer system facing downwards, on a perforated mask (hole diameter 5 mm). The elements Mg and Ag are vapourized simultaneously from two vapour deposition boats at a pressure of $10^{-3}$ Pa. The vapour deposition rates are 28 Å/sec for Mg and 2 Å/sec for Ag. The thickness of the metal contacts applied by vapour deposition is 500 nm.

The two electrodes of the organic LED are connected to a voltage source via electric leads. The positive pole is connected to the ITO electrode and the negative pole is connected to the Mg/Ag electrode.

From a voltage of only 2.5 volt, it is possible to detect electroluminescence with a photodiode (EG&G C30809E). At a voltage of 3 volt, a current per unit area of 1 mA/cm² flows and the electroluminescence is clearly visible. The colour of the electroluminescence is green-yellow.

What is claimed is:

1. An electroluminescent arrangement which comprises a substrate, an anode, an electroluminescent element, a cathode, and said anode or said cathode is transparent in the visible spectral range and the electroluminescent element contains at least one zone selected from the group consisting of:

(1) a hole-injecting zone,
   (2) hole-transporting zone,
   (3) electroluminescent zone,
   (4) electron-transporting zone and
   (5) electron-injecting zone, and at least one quinacridone selected from the group consisting of C8 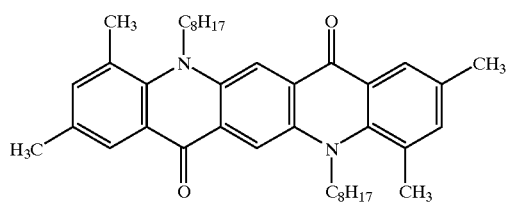
C9 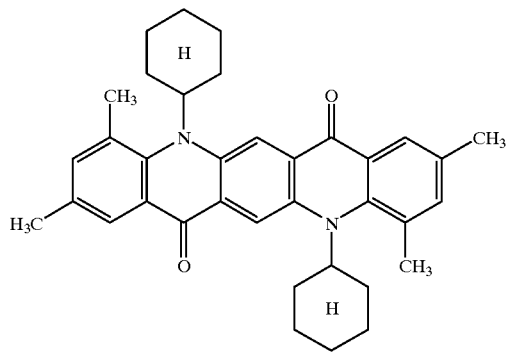
C10 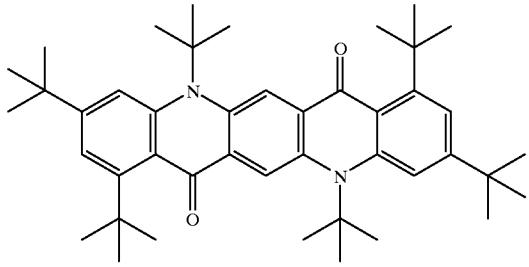
C13 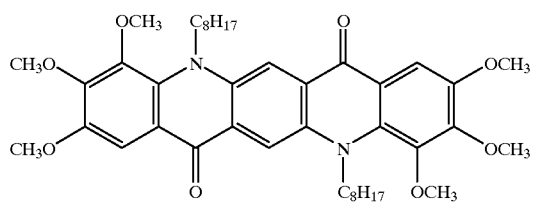
C15 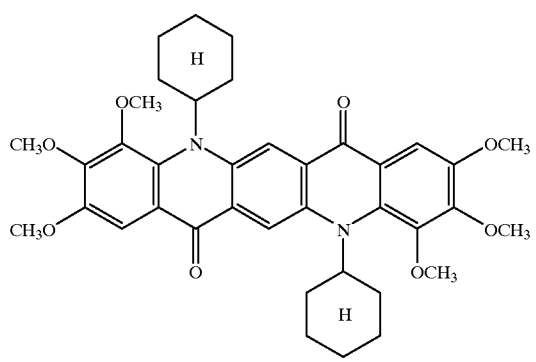
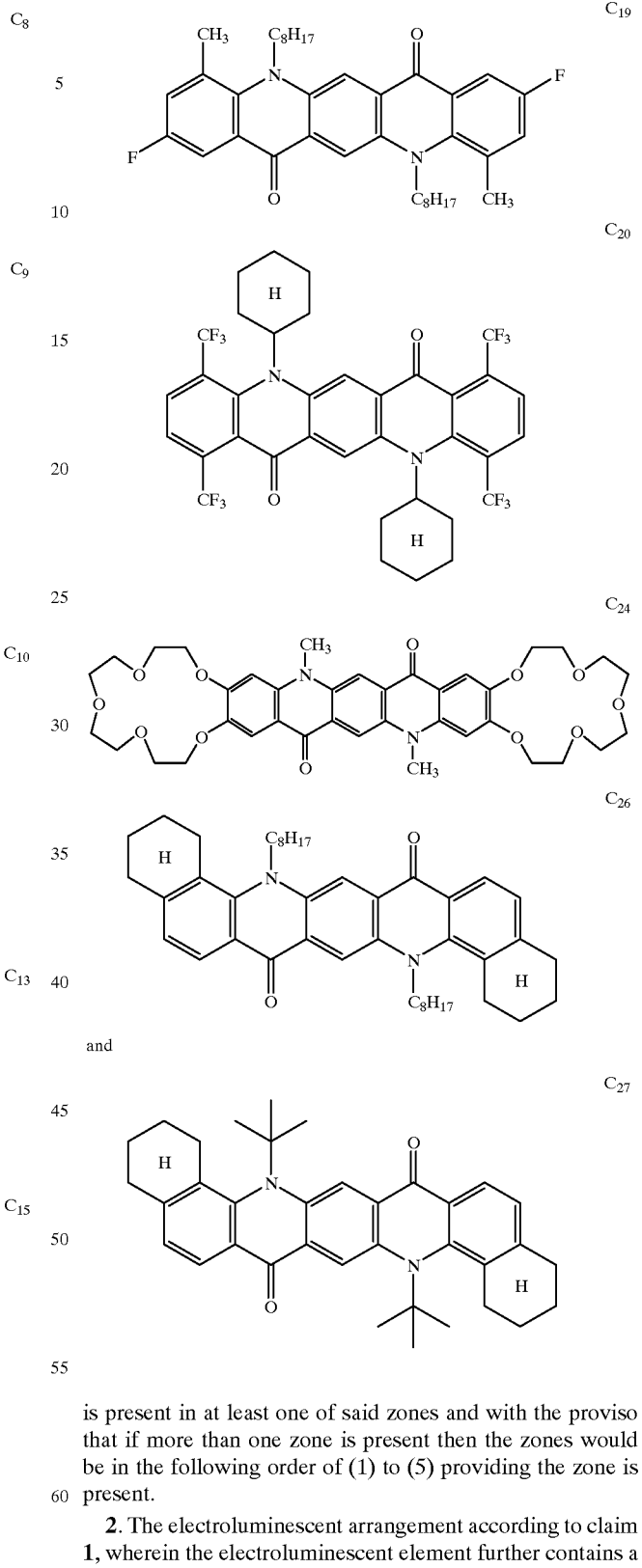
and
is present in at least one of said zones and with the proviso that if more than one zone is present then the zones would be in the following order of (1) to (5) providing the zone is present.
2. The electroluminescent arrangement according to claim 1, wherein the electroluminescent element further contains a transparent polymeric binder.

3. The electroluminescent arrangement according to claim 2, wherein the transparent binder is selected from the group consisting of polycarbonates, polyester carbonates, copolymers of styrene, polysulphones, polymers based on monomers containing vinyl groups, polyolefins, cyclic olefin copolymers and phenoxy resins.

4. The electroluminescent arrangement according to claim 2, wherein the transparent binder is styrene-acrylonitrile copolymer or styrene acrylates.

5. The electroluminescent arrangement according to claim 1, wherein said electroluminescent element further contains an aromatic tertiary amino compound of the formula (I)

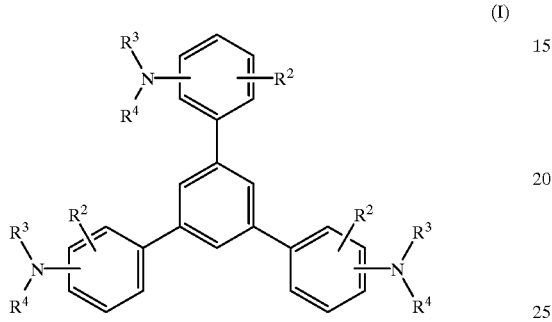

(I)

in which
R$^2$ is hydrogen, halogen, unsubstituted alkyl, or an alkyl substituted with an alkoxy, hydroxy or halogen,
R$^3$ and R$^4$, independently of one another, are optionally substituted C$_1$–C$_{10}$-alkyl, alkoxycarbonyl-substituted C$_1$–C$_{10}$-alkyl, optionally substituted aryl, optionally substituted aralkyl or optionally substituted cycloalkyl, wherein the substitutents are alkyl, alkoxy, hydroxy, aryl or halogen.

6. The electroluminescent arrangement according to claim 5, wherein R$^2$ is hydrogen or C$_1$–C$_6$-alkyl, R$^3$ and R$^4$, independently of one another, are C$_1$–C$_6$-alkyl, C$_1$–C$_4$-alkoxycarbonyl-C$_1$–C$_6$-alkyl, phenyl, naphthyl, phenyl-C$_1$–C$_4$-alkyl, naphthyl-C$_1$–C$_4$-alkyl, cyclopentyl or cyclohexyl, and R$^3$ and R$^4$ are optionally substituted by at least one C$_1$–C$_4$-alkyl or C$_1$–C$_4$-alkoxy.

7. The electroluminescent arrangement according to claim 1, which further comprises a tertiary amine selected from the group consisting of

-continued
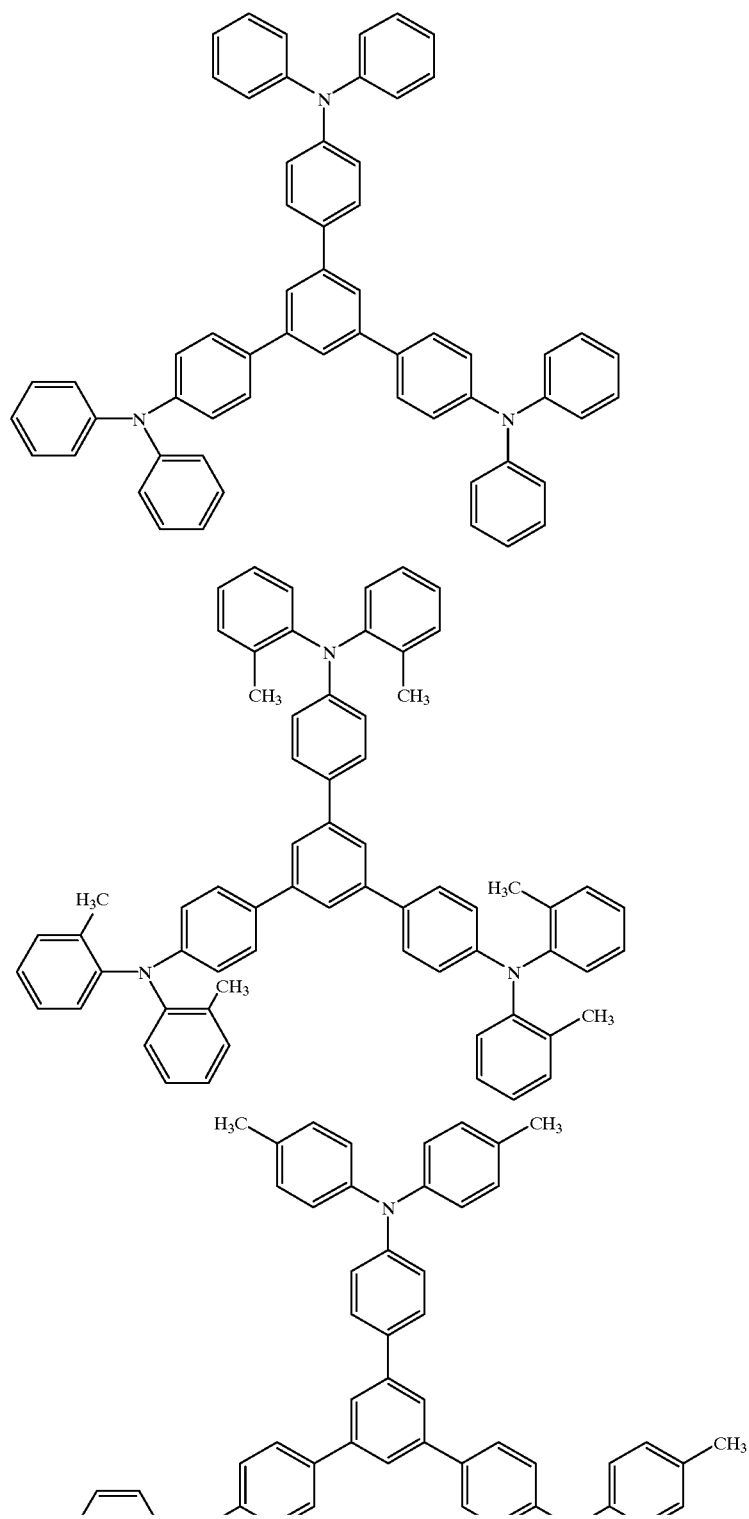

8. The electroluminescent arrangement according to claim 7, which further comprises a luminescent compound of the formula

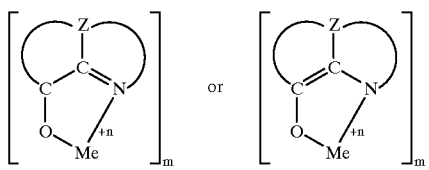

in which

Me represents a metal, m is a number from 1 to 3 n is a number from 1 to 3 and

Z independently in the two forms, represents atoms which complete a nucleus which consists of at least 2 fused rings and wherein the electroluminescent element further contains a transparent polymeric binder.

9. The electroluminescent arrangement according to claim 8, wherein said luminescent compound is selected from the group consisting of oxine complexes of $Al^{3+}$, $Mg^{2+}$, $In^{3+}$, $Ca^{2+}$, $Na^+$, aluminiumtris(5-methyloxine), galliumtris(5-chloroquinoline) and rare earth metal complexes.

10. The electroluminescent arrangement according to claim 1, which further comprises a luminescent compound of the formula

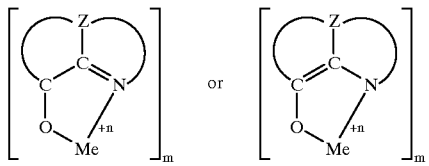

in which

Me represents a metal, m is a number from 1 to 3 n is a number from 1 to 3 and

Z independently in the two forms, represents atoms which complete a nucleus which consists of at least 2 fused rings.

11. The electroluminescent arrangement according to claim 1, wherein the electroluminescent element contains a charge-transporting substance selected from the group consisting of a hole-conducting material and electron-conducting material.

12. The electroluminescent arrangement according to claim 1, wherein the electroluminescent element consists of one layer.

13. The electroluminescent arrangement according to claim 1, wherein the electroluminescent element contains a zone which contains an optionally substituted tris-1,3,5-(aminophenyl)benzene compound, aluminum salt of 8-hydroxquinoline (aluminum oxinate) and polyvinylcarbazole.

14. An article which comprises an electroluminescent arrangement as claimed in claim 1.

15. The article as claimed in claim 14, wherein said article is selected from the group consisting of illumination/backlighting display, information display, segment display and matrix display.

16. The electroluminescent arrangement according to claim 1, wherein the electroluminescent arrangement comprises a trisaminophenyl benzene compound, a luminescent material and a polymeric binder and wherein the sum of the amounts by weight trisaminophenyl benzene compound and luminescent material in the polymeric binder is in the range from about 0.2 to about 98% by weight (based on 100% by weight of trisaminophenyl benzene compound, quinacridone and luminescent material) and the weight ratio weight of trisaminophenyl benzene compound luminescent material is between about 0.05 and about 20 and all the components may be in separate layers.

17. A process for the preparation of the electroluminescent arrangement of claim 1, wherein the quinacridone is dissolved in a solvent and applied by casting, knife-coating or spin-coating.

* * * * *